(12) United States Patent
Manamohan (10) Patent No.: US 10,922,599 B2
(45) Date of Patent: Feb. 16, 2021

(54) MEMRISTOR BASED STORAGE OF ASSET EVENTS

(71) Applicant: Hewlett Packard Enterprise Development LP, Houston, TX (US)

(72) Inventor: Sathyanarayanan Manamohan, Bangalore (IN)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/220,244

(22) Filed: Dec. 14, 2018

(65) Prior Publication Data

US 2020/0193255 A1 Jun. 18, 2020

(51) Int. Cl.
*G06K 19/07* (2006.01)
*G11C 11/21* (2006.01)
*G06F 9/38* (2018.01)
*G06K 19/077* (2006.01)

(52) U.S. Cl.
CPC ....... *G06K 19/0723* (2013.01); *G06F 9/3836* (2013.01); *G06K 19/07749* (2013.01); *G11C 11/21* (2013.01)

(58) Field of Classification Search
CPC .......... G06K 19/0723; G06K 19/07749; G06F 9/3836
USPC .................................................. 235/487, 492
See application file for complete search history.

(56) References Cited

U.S. PATENT DOCUMENTS

| 8,081,129 | B1 | 12/2011 | Santori et al. | |
|---|---|---|---|---|
| 8,113,437 | B2 | 2/2012 | Kang | |
| 2007/0187266 | A1* | 8/2007 | Porter | A63F 1/02 206/232 |
| 2016/0085955 | A1 | 3/2016 | Lerner | |
| 2017/0230285 | A1* | 8/2017 | Crabtree | G06Q 10/0637 |
| 2017/0330174 | A1* | 11/2017 | Demarinis | G06Q 40/04 |
| 2018/0144156 | A1* | 5/2018 | Marin | G06F 21/602 |
| 2019/0050367 | A1* | 2/2019 | Saur | G06F 21/31 |
| 2019/0188804 | A1* | 6/2019 | Parry | G06Q 50/01 |
| 2019/0268140 | A1* | 8/2019 | Kandiraju | G06Q 20/127 |
| 2019/0279204 | A1* | 9/2019 | Norton | H04L 9/0637 |

(Continued)

OTHER PUBLICATIONS

IBM Research, "Crypto-anchors and Blockchain" available online at <https://web.archive.org/web/20181124004820/https://www.research.ibm.com/5-in-5/crypto-anchors-and-blockchain/>, Nov. 24, 2018, 10 pages.

(Continued)

*Primary Examiner* — Paultep Savusdiphol
(74) *Attorney, Agent, or Firm* — Brooks, Cameron & Huebsch, PLLC (57) ABSTRACT

An example device comprising contactless circuitry to receive data about a plurality of events corresponding to an asset, and a memristor coupled to the contactless circuitry to store the data about the plurality of events. The contactless circuitry may determine that the asset has experienced an event, receive a transaction corresponding to the event from a decentralized entity, generate a hash of the transaction including a device identifier of the contactless circuitry and the transaction received from the decentralized entity, verify the hashed transaction with the decentralized entity, and store the verified hashed transaction on the memristor of the contactless circuitry, wherein the stored verified hash includes information about the event.

20 Claims, 5 Drawing Sheets

(56) References Cited

U.S. PATENT DOCUMENTS

2019/0325048 A1* 10/2019 Watkins .............. G06F 16/2365
2019/0327080 A1* 10/2019 Liu ....................... H04L 9/3265

OTHER PUBLICATIONS

Blockchain Allows Sneaker Manufacturer to Prevent Counterfeiting, (Web Page), Jun. 6, 2016, 4 Pgs.
Blockchain and Smart Card Technology, (Web Page), Mar. 2017, 34 Pgs.
Blockchain Digital Passport, (Web Page), Retrieved Sep. 24, 2018, 8 Pgs.
Blockchain: The Solution for Transparency in Product Supply Chains, (Web Page), Nov. 21, 2015, 21 Pgs.
How and Why We Invented the CryptoSeal, (Web Page), Nov. 17, 2016, 5 Pgs.
WISeKey Partners with the Blockchain Interface Company Riddle &Code to Develop Innovative Solutions for Securing IoT via Blockchain Technology and Crypto-hardware, (Web Page), Jun. 14, 2017, 4 Pgs.
Desley Mooij, "What is Seal?", available online at <https://medium.com/sealnetwork/what-is-the-seal-network-cdebb6cf53>, Feb. 20, 2018, 5 pages.

* cited by examiner

MEMRISTOR BASED STORAGE OF ASSET EVENTS

BACKGROUND

Provenance records of assets may be tracked to determine the origin of the assets and modifications of the assets. The provenance records may be stored as heuristic records in computing devices. The heuristic records may be used to determine if an asset is authentic and/or if it has been altered. The heuristic record may track the asset from its generation until the end of its lifecycle.

DETAILED DESCRIPTION

Assets such as manufactured products, food, drink, pharmaceuticals, computing devices, clothing, etc. may experience multiple events during the lifecycle of the asset. As used herein, the term "event" refers to an occurrence which affects an asset. Some examples, of events include the generation or an asset, a change in ownership, a change in geographical location, a change in state of the asset, etc. The events may alter the physical characteristics, the geographical location, the ownership, a change in state, etc. or a combination thereof. Assets may be tracked from the genesis of the asset to the end of the life of the asset. The end of life for an asset may be when the asset is obtained by an end user, is destroyed, consumed, etc. As used herein, the term "lifecycle" refers to the life of the asset from genesis to the end of the life of the asset. The tracking of assets may be used to detect when/if an asset has experienced an event.

For example, asset tracking may be used for many applications of supply chain logistics to track data about the creation of the asset, data about shipment of the asset, installation of the asset into another asset (a microchip installed into a computing device), ownership of the product, etc. Further, the end user of the product may be interested in tracking the provenance records of the product to establish where the asset was created, amongst other information. In the field of food and/or pharmaceutical production, provenance information of a product may be used to determine product recall information. For asset tracking, transactions corresponding to events experienced by the asset may be stored as an immutable record in a decentralized entity.

As used herein, the term "decentralized entity" refers to an open-source, distributed computing platform. In some examples, a decentralized entity may be a part of a public platform such as a public cloud. In some examples, the decentralized entity may be deployed on a private network such as a private cloud. The decentralized entity may include distributed ledger technology (DLT). The DLT includes a consensus of replicated, shared, and synchronized digital data which may be spread across multiple computing devices. In some examples, the decentralized entity may be a blockchain-based distributed computing platform. For example, a block of the blockchain may include information and may be added to a blockchain as an immutable record, the blocks may be linked together utilizing a hash function applied to the information about the event and the transaction. As sued herein, the term "transaction" refers to information and/or data which may be verified, encrypted, and stored as a block. As used herein, the term "hash function" refers to a cryptographic series of numbers and characters to act as a digital fingerprint applied to a piece of information to secure the information, prevent error, and/or be stored with a transaction. The transactions stored in the blockchain track the provenance information of an asset because the transaction includes information corresponding to the asset. The information about the asset may correspond to a device coupled to the asset.

As used herein, the term "device" refers to a physical carrier of contactless circuitry which may be bonded to an asset. The device bonded to the asset may include circuitry such that it may communicate with other devices and/or the blockchain. Some examples, of devices are cards, smartcards, microchips, etc. Devices used for asset tracking may be small enough to be woven into materials of the asset, or otherwise inconspicuously bonded to the asset. When the device is bonded to the asset, it may provide identifying information about the asset and communicate when an event has occurred, is occurring, and/or will occur such that the records of the events may be stored in the blockchain. In this way, a user in possession of the asset may use the device coupled to the asset to as a key to obtain information about the asset in the digital system of the decentralized entity. This results in a system that is secure but has limited security guarantees because the asset verification and queries on the provenance of the asset rely on an individual hash function. In other words, the asset itself does not include any data to verify the provenance records in the device coupled to the asset. It may be technically challenging to store secure provenance records about the assets in the devices.

As such, examples discussed herein provide examples, of devices coupled to assets to track the provenance information of the assets and securely store the events on the device coupled to the asset itself. In this way, the asset is involved with every transaction created in response to an event. For example, as each transaction is stored as a block in the blockchain, another record is created, encrypted, and securely stored as a local block on the device coupled to the asset. Devices such as smartcards include a storage device (e.g., EEPROM) that is not large enough to include such provenance records. As such examples, herein describe devices created to include a memristor storage device in place of a smaller storage device (e.g., EEPROM).

As used herein, the term "memristor" refers to a non-volatile, random access, memory component with read and write storage capabilities, based on resistive memory properties. A memristor may utilize a similar footprint and utilize a similar energy demand as a smaller memory capacity device such as an EEPROM. However, a memristor may include a larger memory capacity when compared to other memory storage devices such as EEPROM. For example, a memristor may provide increased storage due to the higher packing densities that memristors can achieve on the same or comparable on-chip real estate (e.g., footprint). Additionally, memristors may not demand a large amount of power to write the memristors base memory. Therefore, the size of the device may not increase due to the addition of a memristor. Specifically, the memristor may be coupled to contactless circuitry included in the device where the contactless circuitry is to determine when an asset has experienced an event, receive a transaction from a decentralized entity about the event, encrypt the transaction, verify that the event is valid, and store the event as an immutable record in the decentralized entity and in the device coupled to the asset.

Figure 1:
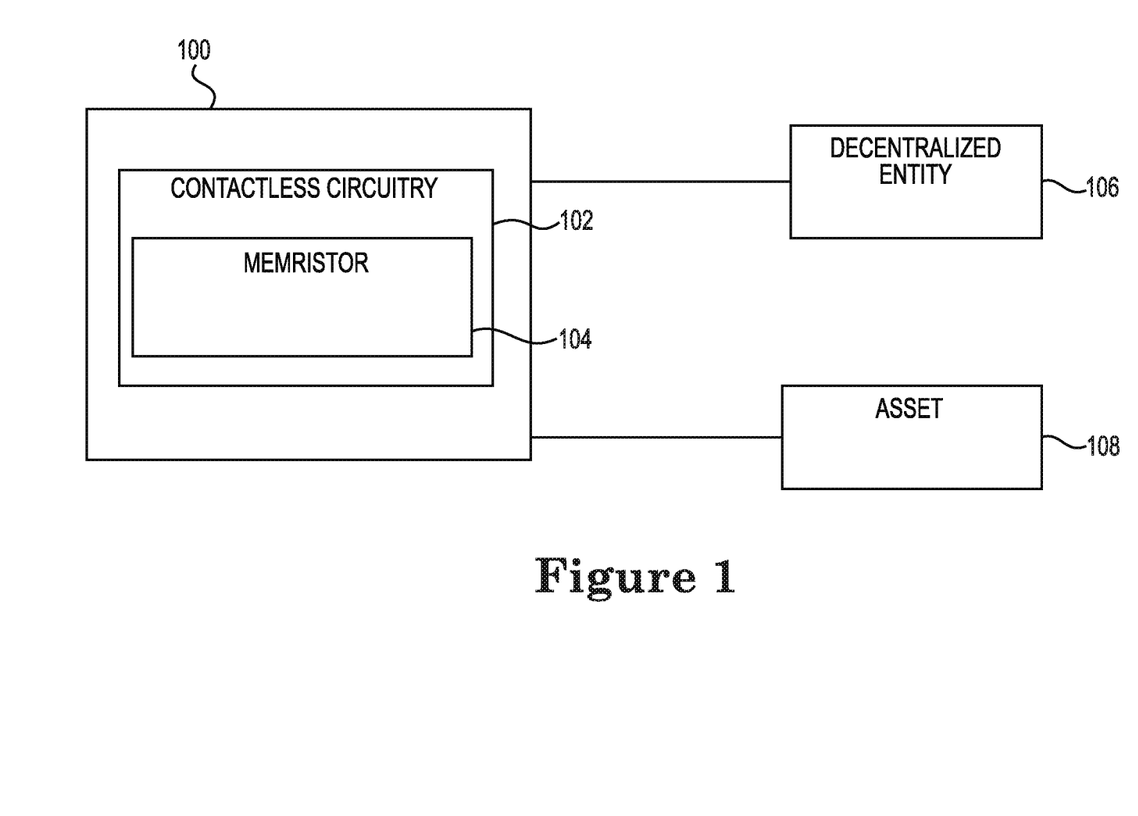
FIG. 1 illustrates an example device including a memristor for memristor based storage of asset events consistent with the disclosure.

FIG. 1 illustrates an example device 100 including a memristor 104 for memristor based storage of asset events consistent with the disclosure. FIG. 1 illustrates a device 100 including contactless circuitry 102, and a memristor 104. The device 100 may be coupled to a decentralized entity 106, and an asset 108. As used herein, the terms "in contact," "connected," and/or "coupled to" refer to an element which may be directly in contact, connected, or coupled with the other element. For example, the device 100 may be connected to the decentralized entity 106 via a radio frequency and/or a wireless connection between the decentralized entity 106 and the contactless circuitry 102 of the device 100. The asset 108 may be connected to the device 100 directly. For example, the device 100 may be a card that is directly bonded to the asset 108. As used herein, the term "bonded" refers to a powerful adhesion of two elements.

For example, the device 100 may be bonded to the asset 108 such that the asset 108 and the device 100 appear to be an individual portion of the asset 108. In other words, the device 100 may be bonded to the asset 108 such that the device 100 is inconspicuous and may appear to be a part of the asset 108. In some examples, the device 100 may be fused to the asset 108 such that the device is a permanent addition to the asset 108. For example, the device 100 may be molded into the asset 108 such that the removal of the device 100 may render the asset 108 damaged. The device 100 may be flexible such that it may be woven into a fabric when the fabric is part of the asset 108. The device 100 includes contactless circuitry 102 to enables the device 100 to communicate.

As used herein, the term "contactless circuitry" refers to circuitry that enables contactless communication between devices. For example, the contactless circuitry 102 may include embedded integrated circuits which may store and/or process data and communicate with a terminal of another device using near-field communication. For example, the contactless circuitry 102 of the device 100 may receive data about a plurality of events corresponding to the asset 108. For example, the plurality of events may be events that are a part of the lifecycle of the asset 108. The lifecycle of the asset 108 includes the genesis of the asset 108 until the asset 108 is used by an end user, and/or destroyed, etc. Specifically, the initial event of an asset's 108 lifecycle may be the instance it is created (e.g., when a processor is manufactured), a first event may be when the asset 108 is physically altered (e.g., the processor is installed into a laptop), and a subsequent event (e.g., a second event) may be when the asset 108 is shipped to a different location (e.g., the laptop is shipped to a wholesaler), etc. In other words, the plurality of events may be, physical modifications of the asset 108, changes of a location of the asset 108, a change in state of the asset 108, a change in ownership of the asset 108, or combinations thereof. The contactless circuitry 102 includes a memristor 104 to store information about the plurality of events.

For example, the memristor 104 is coupled to the contactless circuitry 102 to store the data about the plurality of events. Specifically, the memristor 104 may store each event of the plurality of events as a verified hashed transaction on the memristor 104 in sequential order. For example, when the device 100 is initially bonded to the asset 108, the contactless circuitry 102 may generate a digital image of the asset 108 to be stored in the decentralized entity 106 and the memristor 104 when the asset 108 is coupled to the device 100. This may be the initial event which may be the first block stored in the decentralized entity 106 and stored as a local block in the memristor 104. As used herein, the term "local block" refers to the encrypted secure block of information that is stored in the memristor 104. A local block may be stored in the memristor 104 as a provenance record of an event experienced by the asset 108. For example, the memristor 104 may operate as a local blockchain coupled to the asset 108. Specifically, the contactless circuitry 102 may apply a hash function (e.g., hash) data about the asset 108, the transaction, and the transaction that may have occurred before the current transaction in a similar manner as a blockchain except on the asset 108 itself. This is discussed in further detail in connection with FIG. 3. Part of the information hashed by the contactless circuitry 102 may be a unique identifier of the contactless circuitry 102.

For example, the device 100 may be coupled to the asset 108, and the transaction may include a unique device identifier (device ID) corresponding to the contactless circuitry 102 and the asset 108 to which the contactless circuitry 102 is coupled. As used herein, the term "device identification" (device ID) refers to the unique identifier corresponding to the contactless circuitry 102 included on the device 100. The contactless circuitry 102 of the device 100 may be encrypted and stored with the transaction that creates the digital image of the asset 108 when the device 100 is bonded to the asset 108. The generation of the secure device ID with the digital image of the asset 108 may be stored as an initial block in the decentralized entity 106 corresponding to the asset 108. To create an immutable provenance record coupled to the asset 108 itself, the contactless circuitry 102 may utilize the memristor 104 to store a local block including the secure device ID with the digital image of the asset 108. In this way, the initial immutable record stored both in the decentralized entity 106 and the memristor 104 is a record identifying the contactless circuitry 102 and the asset 108 to which it is coupled. The device ID may be included as part of the hash when the asset 108 experiences events.

For example, the contactless circuitry 102 may determine that the asset 108 has experienced an event. In some examples, the contactless circuitry 102 may determine that the asset 108 has experienced and event via a radio frequency identification (RF) interface. For example, the contactless circuitry 102 may include a RF interface and contactless communication functionality, where the RF interface may identify the event by receiving and/or transmitting radio signals between devices wirelessly. In response to the determined event, the contactless circuitry 102 may receive a transaction corresponding to the event from the decentralized entity 106. For example, the contactless circuitry 102 may receive a unique transaction identifier about the event. Specifically, if the asset 108 is a processor, the event may be when the processor is moved from the factory floor to a logistics site, so the unique transaction identifier may be information about the movement of the processor (e.g., the asset 108) from the factory to the logistics site. The contactless circuitry 102 may then apply a secure hash to the transaction.

In some examples, the contactless circuitry 102 may generate a hash including the unique device ID of the contactless circuitry 102 and the transaction received from the decentralized entity 106. The transaction may be received from the decentralized entity 106, or the transaction may be extracted from the decentralized entity 106. In other words, the hash generated by the contactless circuitry 102 includes the same transaction used by the decentralized entity 106 to create a block to be stored as an immutable record. The hash created by the contactless circuitry 102 includes the transaction corresponding to the event, either received or extracted from the decentralized entity 106, the unique device ID, a random number (e.g., a nonce), and the hash function from the previous transaction. In advance of storing the transaction as a block in the decentralized entity 106 or as a local block in the memristor 104 coupled to the asset 108, the transaction may be verified.

For example, the contactless circuitry 102 may verify the hashed transaction with the decentralized entity 106. For example, the contactless circuitry 102 may verify the hashed transaction by comparing the hashed transaction with a condition of a smart contract deployed on the decentralized entity 106. As used herein, the term "smart contract" is a protocol to digitally facilitate, verify, and/or enforce a negotiation and/or a performance of information in credible transactions. The smart contract may reside on the decentralized entity 106 which may include a distributed ledger technology (DLT), (e.g., a blockchain with smart contract capabilities) such that the smart contract may be accessed by the device 100 (and/or the contactless circuitry 102). A smart contract may be created by an entity with an interest in the asset 108 (e.g., a manufacture, an end user, a purchaser, etc.) these entities may create, modify, delete or otherwise update provisions (e.g., specifying a condition such as particular allowed event, dates, times, geographical areas, etc.) using at least one smart contract. In this way, the event may be controlled, and sanctioned by the device in exchange for a reward upon mutual agreement. Further, by leveraging the decentralized entity 106 with smart contract capability, the immutable record of the transaction can be digitally verified as the events alter the asset 108, and the immutable record may be locally stored in the memristor 104.

For example, the contactless circuitry 102 may store the verified hashed transaction on the memristor 104 of the contactless circuitry 102, where the stored verified hash includes information about the event. The verified hash transaction may be secure and encrypted and stored as a local block in the memristor 104. In response to the verification by the decentralized entity 106, the asset 108 may be modified and an approval transaction identification may be transmitted to the contactless circuitry 102, which may be securely stored with the hashed transaction. As mentioned, the contactless circuitry 102 may store the verified hash transaction as an immutable record in the decentralized entity 106 and the memristor 104. In other words, the verified hashed transaction may be stored as a block, and the block may include information about the transaction preceding, and this may be stored as an immutable record in the blockchain. The same information may also be stored as an immutable record (e.g., a local block) on the memristor 104 coupled to the asset 108. In this way, the asset 108 may be meshed with the blockchain (decentralized entity 106), such that the memristor 104 may store a verified hashed transaction record corresponding to each event of the plurality of events. Examples described herein may apply to the creation of a new asset which includes an existing asset and/or collection of existing assets (e.g., creating a computing device including existing assets).

For example, as mentioned, a first event may include an initial instance when the asset 108 is bonded to the device 100. A subsequent event may be a second event which may include the asset 108 being integrated into a different asset. For example, if a first asset 108 is a processor, the first event may be when the processor is bonded to a first device 100. A second event may be the processor being integrated into a second asset e.g., a computing device, where the computing device may be bonded to a second device (e.g., similar to the device 100). In this example, the computing device may be a second asset comprising the first asset 108 (e.g., the processor) bonded to the first device 100. As such, a first event experienced by the second asset (the computing device) may be the instance when the first asset 108 (the processor) is integrated into the computing device. Thus, the first transaction for the computing device may include information about the processor (e.g., the first asset 108). Since the first asset 108 (the processor) and the second asset (the computing device) both include a device (e.g., the device 100) they both may utilize a memristor based event storage to leverage secure encryption of provenance records. As such, examples described herein may be applied to a new asset (the computing device) which may include an existing asset 108 (e.g., the processor) and/or a plurality of existing assets (e.g., other components of the computing device).

The examples described in connection with FIG. 1 describe memristor 104 based storage of asset events where the provenance records of an asset are stored in sequential order as the data is stored on a decentralized entity 106. A device 100 including contactless circuitry 102 with a memristor 104 securely bonded to the asset 108 meshes the asset 108 itself with provenance records that were otherwise stored separately in the decentralized entity 106. Leveraging secure encryption included with the contactless circuitry 102 with the storage capabilities of the memristor 104 provides a layer of security otherwise not available.

Figure 2:
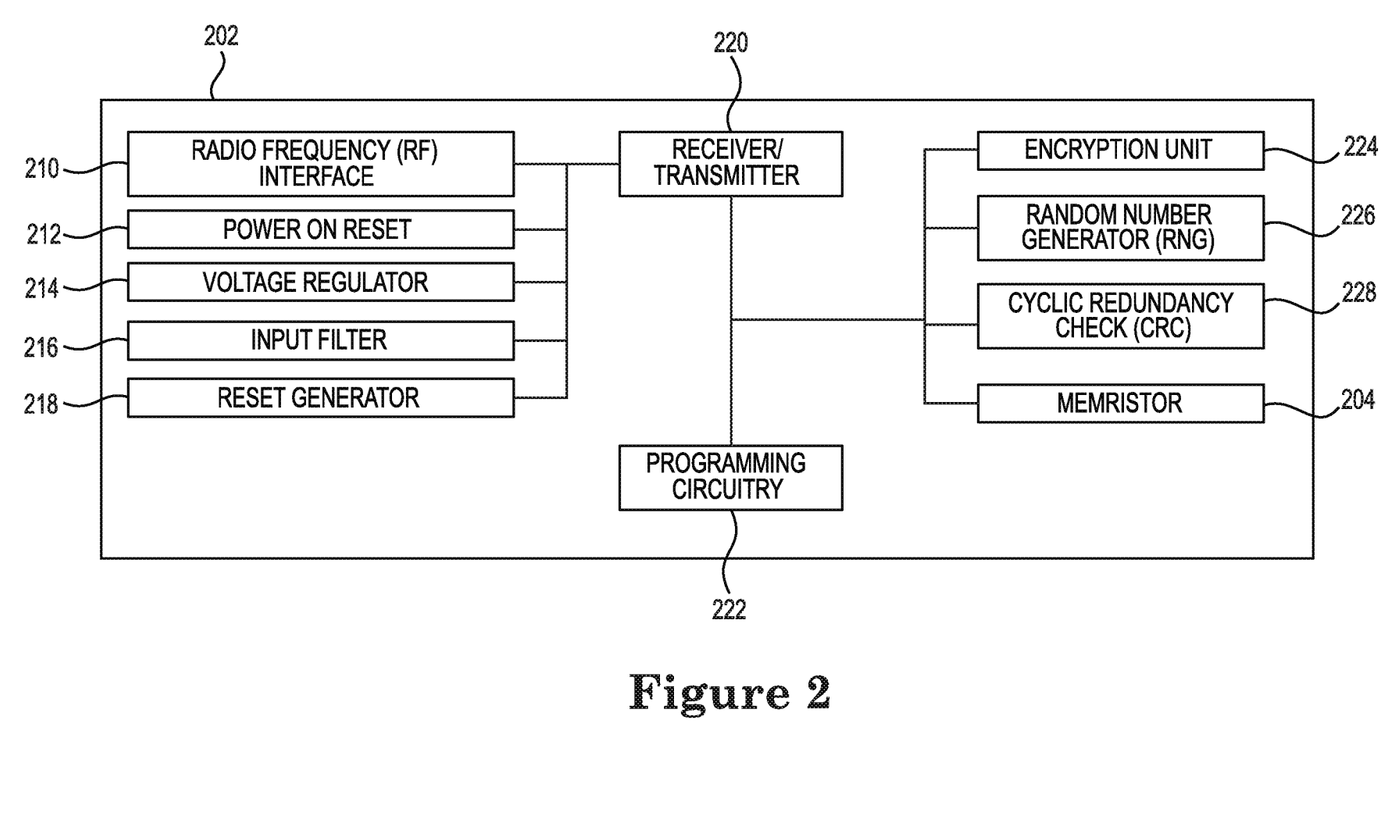
FIG. 2 illustrates an example contactless circuitry including a memristor for memristor based storage of asset events consistent with the disclosure.

FIG. 2 illustrates an example contactless circuitry 202 including a memristor 204 for memristor based storage of asset events consistent with the disclosure. The contactless circuitry 202 illustrated in FIG. 2 includes a radio frequency (RF) interface 210, a power on reset 212, a voltage regulator 214, an input filter 216, a reset generator 218, a receiver/transmitter 220, programming circuitry 222, an encryption unit 224, a random number generator (RNG) 226, cyclic redundancy check 228, and a memristor 204. Although not illustrated in FIG. 2 as to not obscure the examples of the disclosure, the contactless circuitry 202 may be included in a device (e.g., the device 100) bonded to an asset (e.g., the asset 108). FIG. 2 illustrates the memristor 204 integrated with other components of the contactless circuitry 202.

The integration of the memristor 204 into the contactless circuitry 202 provides an on-chip storage of provenance records. As mentioned, the contactless circuitry 202 may include a RF frequency interface 210. In some examples, the RF frequency interface 210 may include an antenna than enables the RF frequency interface 210 to transmit the device ID to an RF frequency interface reader. For example, the RF frequency interface 210 may transmit the unique device ID of the contactless circuitry 202 and to identify that an event. In other words, during an event, the RF frequency interface 210 may be positioned within range of an RF reader (e.g., the asset may be scanned by an RF reader) so that the event may be verified and stored in a decentralized entity (e.g., the decentralized entity 106) and the memristor 204. The RF frequency interface 120 may be coupled to circuitry used to reset the power to the contactless circuitry 202.

For example, the contactless circuitry 202 may include a power on reset 212, and a reset generator 218. As used herein the term "power on reset" refers to a microcontroller or microprocessor that ensures that the device operates in a known state in response to a reset signal. As used herein, the term "reset generator" refers to a microcontroller or microprocessor that generates a reset signal when power is applied to the device. For example, the reset generator 218 may generate a reset signal when the contactless circuitry 202 is to be reset. Thus, the power on reset 212 may restore the restarted contactless circuitry 202 to a known state such that it may continue to verify, encrypt, and store transactions as a local block in the memristor 204. The contactless circuitry 202 may also include a voltage regulator 214 and an input filter 216.

As used herein, the term "voltage regulator" refers to a system designed to maintain a constant voltage. For example, the voltage regulator 214 may protect the contactless circuitry 202 from a harmful amount of voltage which may damage the contactless circuitry 202 components. As used herein, the term "input filter" refers to an electrical component that eliminates extraneous pulses on input lines. An example of an input filter may be a clock input filter to set delays to filter signals during periods of low passage and high passage signal transmission. The contactless circuitry 202 may include a receiver/transmitter 220 and programming circuitry 222.

In some examples, the receiver/transmitter 220 may be a computer hardware device for communication between devices. For example, the receiver/transmitter may be a universal asynchronous receiver-transmitter (UART). A UART may provide serial communication for the contactless circuitry 202. The receiver/transmitter 220 may have data format and transmission speeds that may be altered or set by the programming circuitry 222. As used herein, the term "programming circuitry" refers to a programmable logic device which may execute programmed instructions. For example, the programming circuitry 222 may be an integrated circuit such as field programmable gate array (FPGA), an application specific integrated circuit (ASIC). The instructions may be programmed prior to installation in the device, or while the programming circuitry 222 is installed in the device. For example, the programming circuitry 222 may include instructions to securely store provenance information in the memristor 204 as a local block.

For example, the contactless circuitry 202 may include an encryption unit 224. As used herein, the term "encryption unit" refers to a component used to convert data into a code to secure the data. In some examples, the encryption unit may execute secure encryption using CRYPTO-1 or similar. The encryption unit 224 may be used to encrypt the transaction provided by a decentralized entity in response to an event. The encryption unit 224 may be used to provide encryption to each of a plurality of events in response to the asset which is coupled to the contactless circuitry 202 having experienced an event. As mentioned, the encryption unit 224 may provide secure encryption to the transactions, and the encrypted transaction may be used as a portion of a hash with a random number generated by the random number generator 226.

For example, a random number generator 226 may generate a random number (RNG) and may be a component that generates a sequence of numbers and/or symbols whose probability of predictability are not better than random chance. In some examples, the RNG generated by the random number generator 226 may be a nonce. The random number generator 226 may produce an RNG may be a hardware random number generator, or a pseudo-random number generator. The contactless circuitry 202 may also include a cyclic redundancy check 228 (CRC). As used herein, the term "cyclic redundancy check" (CRC) refers to an error detecting code used in digital networks and storage devices to detect changes to data. The CRC 228 may be used to detect error caused by noisy transmission channels. The components of the contactless circuitry 202 may be used to securely store the transactions describing provenance records of the asset as a local block in the memristor 204. The memristor 204 may be of a size that it may fit on the contactless circuitry 202 such that the contactless circuitry 202 may operate as a chip with smartcard capabilities. In other words, the contactless circuitry 202 may operate as a smartcard with the added functionality to store larger pieces of data (local blocks) in sequential order on the memristor 204. Because the contactless circuitry 202 is part of a device that is securely bonded to the asset itself, the asset is meshed with the secure provenance records about the asset.

The examples described in connection with FIG. 2 describe memristor 204 based storage of asset events where the provenance records of an asset are stored in sequential order as the data is stored on a decentralized entity. The memristor 204 is a part of the contactless circuitry 202 and is integrated on the contactless circuitry 202 such that the provenance records may be stored on-chip. The ability to store provenance record information on-chip via the memristor 204 provides increased security when compared to contactless circuitry absent memristor 204 storage capabilities. Additionally, storing provenance records as local blocks on the memristor 204 mesh the asset itself into the provenance records because the contactless circuitry is bonded to the asset via a device (e.g., a smartcard).

Figure 3:
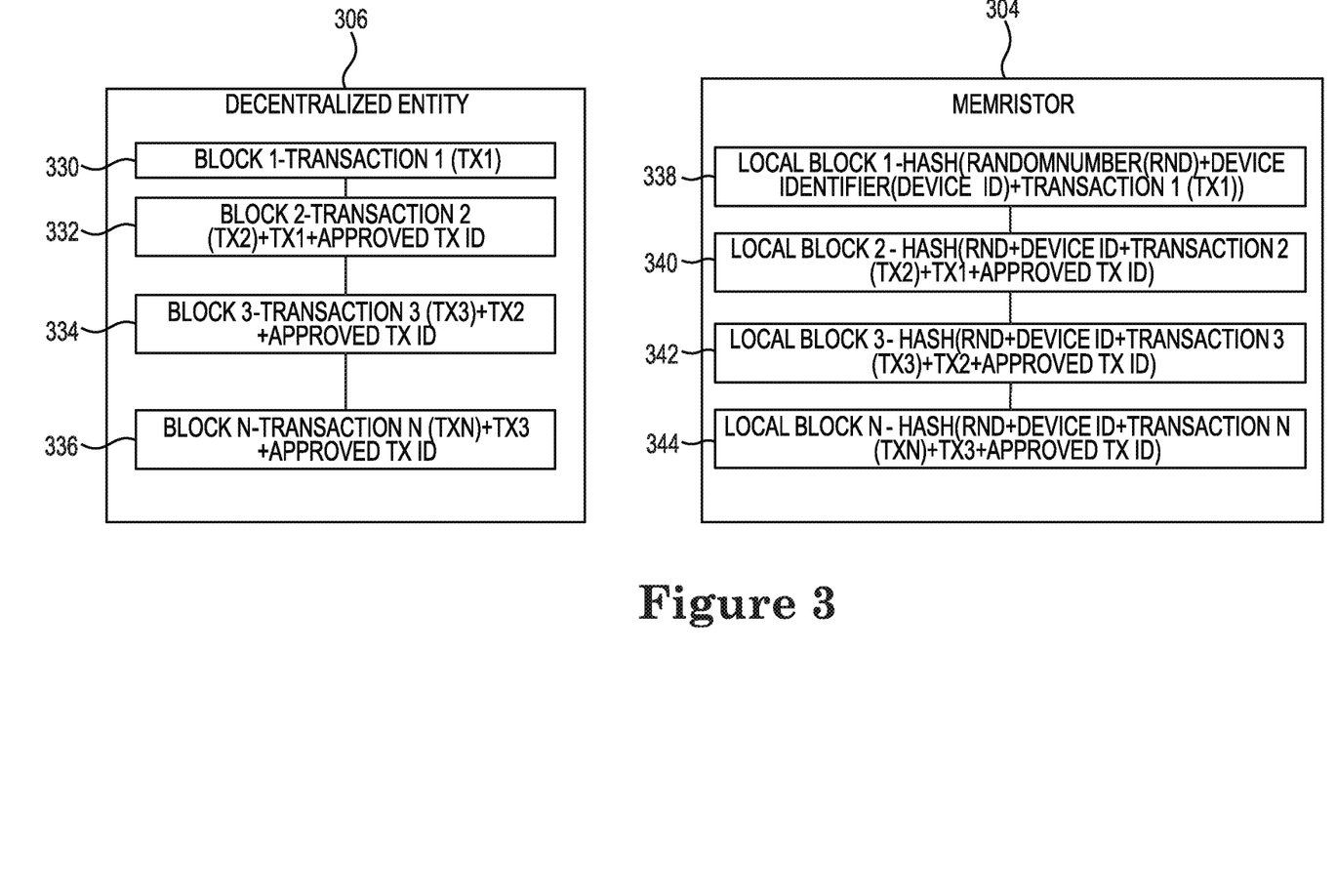
FIG. 3 illustrates an example decentralized entity and an example memristor for memristor based storage of asset events consistent with the disclosure.

FIG. 3 illustrates an example decentralized entity 306 and an example memristor 304 for memristor based storage of asset events consistent with the disclosure. FIG. 3 illustrates a decentralized entity 306 (e.g., a blockchain) including a plurality of blocks 330, 332, 334, and 336, each representing a stored record of a plurality of events. FIG. 3 illustrates a memristor 304 including a plurality of local blocks 338, 340, 342, and 344, each representing a stored record of a plurality of events. Although not pictured in FIG. 3 as to not obscure examples of the disclosure, the memristor 304 may be a part of contactless circuitry (e.g., the contactless circuitry 202) coupled to a device (e.g., the device 100) bonded to an asset (e.g., the asset 108), the contactless circuitry and the asset may be in communication with the decentralized entity 306. The blocks of the decentralized entity 306 include transactions which are representative of the events experienced by the asset.

For example, block 330 includes transaction 1 (TX1), which may be the initial event of the device comprising the contactless circuitry being coupled to the asset. In other words, the first event may be an initial event of the device (e.g., a smartcard) providing a unique ID of the device and the asset it is coupled to the decentralized entity 306 to be stored as an immutable record about the asset. Each event of the plurality of events corresponds to a transaction on the decentralized entity 306, and each transaction is obtained by the contactless circuitry from the decentralized entity 306 such that it may be stored locally on the memristor 304. As such, the memristor 304 may store local block 338 as a hash including an RND, the unique device ID (identifying the contactless circuitry bonded via the device to the asset), and the first transaction TX1 (which represents the initial event of the bonding of the device to the asset). As the lifecycle of the asset continues, more blocks are added both to the decentralized entity 306 and the memristor 304. In some examples, the transaction may be verified, and an approval ID may be stored in the hash of the local blocks of the memristor 304 and the hash may store some information about the transaction that occurred prior to the approved transaction.

For example, each verified hashed transaction corresponding to each event of a plurality of events may be stored by the memristor 304 includes information about the previously stored transaction. Specifically, a second event may be the asset being installed into another device (e.g., the asset is a processor and the second event is the processor installed into a laptop). The second block 332 stored in the decentralized entity 306 may include-the second transaction (TX2) with information about the hash of the first event (e.g., the first transaction TX1) and the approved transaction identifier (TX ID). Similarly, the second local block 340 includes a hash including an RND, the device ID, the second transaction TX2, TX1, and the approved TX ID.

FIG. 3 illustrates an example of a third event which may be the asset being moved to a different geographical location (e.g., the asset is a processor installed into a laptop, and the laptop is shipped from the manufacture to a warehouse). The third block 334 stored in the decentralized entity 306 may include-the third transaction (TX3) with information about the hash of the second event (TX2) and the approved TX ID. Similarly, the third local block 342 includes a hash including an RND, the device ID, the third transaction TX3, TX2, and the approved TX ID. The local blocks of the memristor 304 may be stored in this format until the Nth event.

For example, FIG. 3 illustrates an example of a fourth event which may be the asset being changing ownership to a different owner (e.g., the asset is a processor installed into a laptop, and the laptop is sold from the manufacture to a to a distributer). The fourth block 336 stored in the decentralized entity 306 may include-the Nth transaction (TXN) with information about the hash of the third event (TX3) and the approved TX ID. Similarly, the Nth local block 344 includes a hash including an RND, the device ID, the Nth transaction TXN, TX3, and the approved TX ID.

The local blocks stored in the memristor may be encrypted and securely stored in sequential order where the hash of the second transaction (local block 340) includes information about the first transaction (e.g., local block 338) and the first event. As the lifecycle of the asset continues, each event may be stored in the decentralized entity 306 as a block and stored as a local block on the memristor 304. As such, the plurality of events may be represented by local blocks 338, 340, 342, and 344 and stored in a heuristic format such that an end user may track the provenance information of the asset using the data stored on the memristor 304.

The examples described in connection with FIG. 3 describe memristor based storage of asset events where the provenance records of an asset are stored in sequential order on the memristor 304 as the data is stored on a decentralized entity 306. The local blocks 338, 340, 342, and 344 include data about the previous transaction. In this way, the memristor 304 may operate as a local blockchain storing local blocks on the memristor 304 integrated into contactless circuitry bonded to an asset via a device such as a card.

Figure 4:
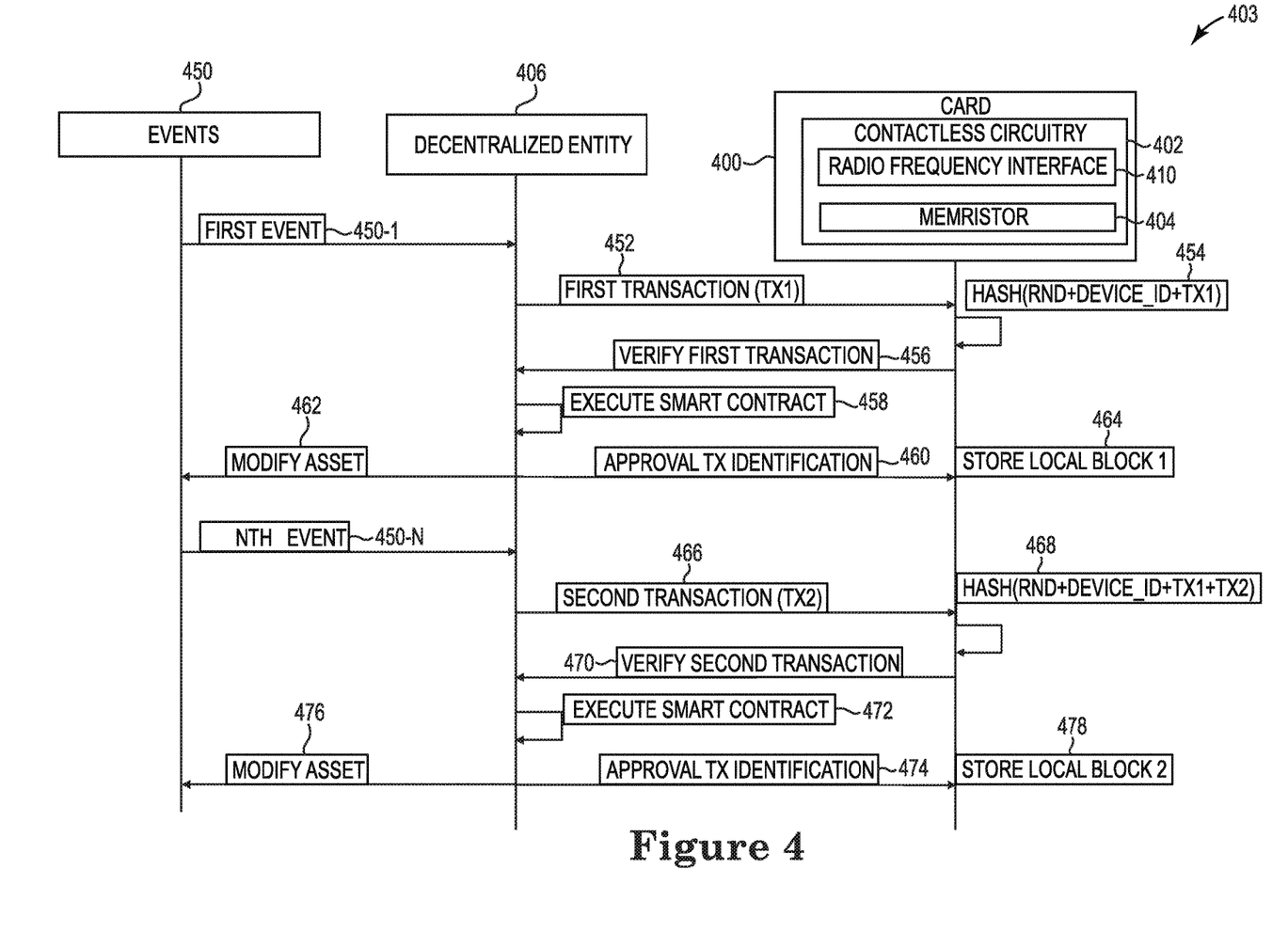
FIG. 4 illustrates an example message flow schematic for memristor based storage of asset events consistent with the disclosure.

FIG. 4 illustrates an example message flow 403 schematic for memristor based storage of asset events consistent with the disclosure. FIG. 4 illustrates a system including a card 400, a contactless circuitry 402 including a radio frequency interface (RF) 410 coupled to the card 400, and a memristor 404 coupled to the contactless circuitry 402. FIG. 4 illustrates a plurality of events 450-1 and 450-N, which may be referred to collectively as the events 450, a decentralized entity 406, the card 400 comprising contactless circuitry 402, the RF interface 410, and the memristor 404. The card 400 may be a device similar to the device 100 described in connection with FIG. 1. The card 400 may be a physical carrier for contactless circuitry 402 with embedded memristor 404. The card 400 as a physical carrier for the contactless circuitry 402 may be bonded to an asset (e.g., the asset 108 of FIG. 1) such that the memristor 404 may provide on-chip provenance records in the order in which the events are experienced by the asset (e.g., sequential order).

For example, the first event 450-1 may be when the card 400 is initially bonded to the asset. When the card 400 is initially bonded to the asset, the contactless circuitry 402 of the card may generate a unique device ID which corresponds to the contactless circuitry 402 of the card 400 and the asset to which the card 400 is bonded. The first event 450-1 may be communicated to the decentralized entity 406 as a first transaction (TX1) 452. For example, the contactless circuitry 402 may receive the TX1 452 including data from the first event 450-1 corresponding to the asset from the decentralized entity 406. The data from the first event 450-1 may be information sufficient to communicate the alteration to the asset (e.g., event 1: the asset is bonded to the card). The contactless circuitry 402 may apply a hash function to the TX1.

For example, the contactless circuitry 402 of the card 400 may hash, at 454, TX1 with the data about the first event 450-1. Specifically, the initial hash about the first event 450-1 may include an RND, the device ID, and TX1. Since this is the initial event the asset has not experienced any other transactions (e.g., based on the events 450 events) to hash with TX1. The card 400 may, at 456, verify TX1 with the decentralized entity 406. For example, the card 400 may, at 458 execute a smart contract by comparing the data from the first event 450-1 including the hashed TX1 to conditions of the smart contract deployed on the decentralized entity 406 to determine if the first event 450-1 is an allowable event. In other words, a smart contract may be created and/or deployed by an entity associated with the asset. The smart contract may comprise conditions set by the entity that created the smart contract. The conditions may relate to the asset and which events 450 are permitted to be experienced by the asset and which events are not permitted to be experienced by the asset.

For example, the contactless circuitry 402 may determine at 458 that the data about the first event 450-1 abides the conditions of the smart contract and receive an approval transaction identifier at 460 in response to the determination that the data about the first event 450-1 abides the conditions of the smart contract and store the approval transaction identifier in the memristor 404 as a first local block (e.g., the local block 338). As used herein, the term "abides" refers to an event being an allowed event. Specifically, in response to the approval TX identification 460, the asset may be modified a 462, and the contactless circuitry 402 may store (at 464) the hashed TX1 as an immutable record (e.g., the first block 330) in the decentralized entity 406 and the memristor 404 coupled to the card (e.g., as a first local block 338). In some examples, the contactless circuitry 402 may determine that the first event 450-1 (and/or any event) does not abide by the smart contract.

For example, the card 400 may determine via the execution of the smart contract that the data about the first event 450-1 does not abide the conditions of the smart contract, the card 400 may receive a rejection transaction identifier in response to the determination that the data about the first event 450-1 fails to abide the conditions of the smart contract; and store the rejection transaction identifier to the memristor 404. The smart contract may demand conditions such as the type of asset, the type of contactless circuitry, the specific modifications to be implemented to the asset based on the event, etc. The smart contract may be executed to verify the plurality of events 450 and prevent error. In some examples, the smart contract may be executed to prevent counterfeit operations, fraud, and nefarious events designed to improperly modify an asset. As such, these events may be stored in the memristor 404 with the hash as local blocks. In this way, the provenance information is stored on-chip and specific to the asset such that they can be reviewed by a user or an owner of the asset in a heuristic format because the events are stored in sequential order.

For example, the asset may experience a subsequent event, such as the Nth event 450-N. The Nth event 450-N may be when the asset is altered by the placement in another object. For example, the asset may be a processor bonded to the card 400 and the Nth event 450-N may be the processor is installed into a laptop. Because the card 400 is bonded to the asset and includes tracking functionality such as the RF interface 410, the contactless circuitry 402 may determine that the that the asset is to be modified during the Nth event 450-N. The card 400 may receive a second transaction (TX2) from the decentralized entity 406 including data about the Nth event 450-N. The contactless circuitry 402 may hash the TX2 at 468. For example, the contactless circuitry 402 may, at 468, hash TX2 with data about the Nth event 450-N and the first transaction TX1.

The card 400 may, at 470, verify TX2 with the decentralized entity 406. For example, the card 400 may compare the data from the Nth event 450-N including the hashed TX2 to conditions of a smart contract deployed on the decentralized entity 406 by executing the smart contract at 472 to determine if the Nth event 450-N is an allowable event. In other words, a smart contract may be created and/or deployed by an entity associated with the asset. The smart contract may comprise conditions set by the entity that created the smart contract. The conditions may relate to the asset and which events 450 are permitted to be experienced by the asset and which events are not permitted to be experienced by the asset. In response to the Nth event 450-N being an allowable event, the asset may be modified at 476, and an approval transaction identification may be transmitted to the card 400 at 474. The approval TX identification may be stored together with the hash of the second transaction. Specifically, at 478, the card 400, via the contactless circuitry 402, may store the hashed TX2 as a new immutable record in the decentralized entity 406 and the memristor 404 included in the card 400 (as a second local block e.g., local block 340).

The examples described in connection with FIG. 4 describe memristor 404 based storage of asset events where the provenance records of an asset are stored in sequential order on the memristor 404 as the data is stored on a decentralized entity 406. A plurality of events 450 corresponding to transactions of the decentralized entity 406 are hashed by the contactless circuitry 402 of the card 400 coupled to an asset. The hashed transactions are compared to smart contracts to verify that the events are allowable events as stipulated by the smart contract. In this way, the memristor 404 may operate as a local blockchain storing local blocks on the memristor 404 integrated into contactless circuitry 402 bonded to an asset via a device such as the card 400.

Figure 5:
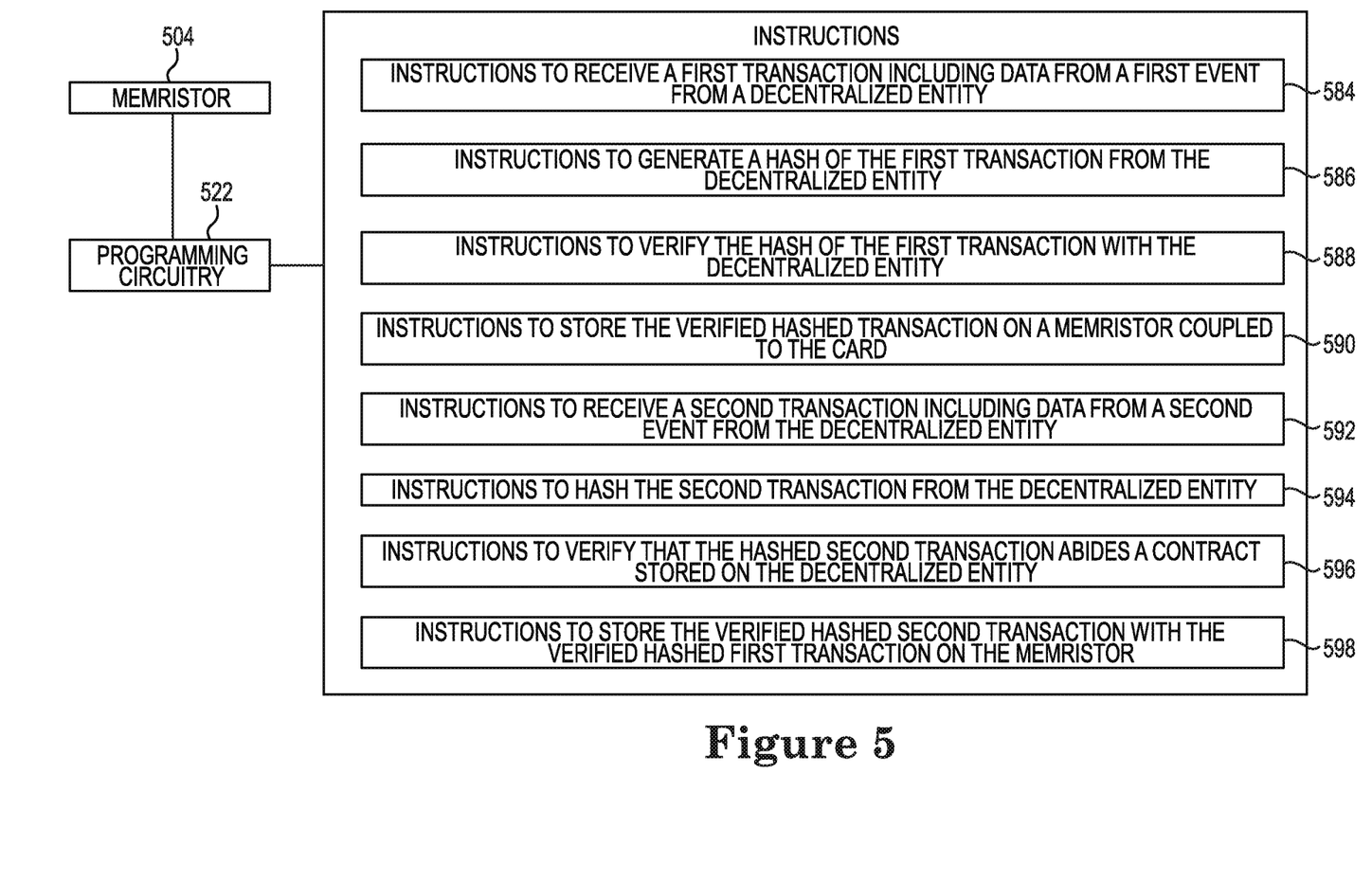
FIG. 5 illustrates an example memristor coupled to programming circuitry for memristor based storage of asset events consistent with the disclosure.

FIG. 5 illustrates an example memristor 504 coupled to programming circuitry 522 for memristor based storage of asset events consistent with the disclosure. Although not illustrated in FIG. 5 as to not obscure the examples of the disclosure, the memristor 504 may be integrated into contactless circuitry (e.g., the contactless circuitry 202), which may be included on a card (e.g., the card 400) bonded to an asset (e.g., the asset 108). The programming circuitry 522 may be a portion of the contactless circuitry and may be programmed with instructions such as instructions 584, 586, 588, 590, 592, 594, 596, and 598, that when executed cause the contactless circuitry to execute the instructions.

For example, the programming circuitry 522 may include instructions 584, that when executed cause the contactless circuitry to receive a first transaction (e.g., the transaction 452) including data from a first event (e.g., the first event 450-1) from a decentralized entity (e.g., the decentralized entity 406). For example, the data from the first event may be information sufficient to communicate the alteration to the asset (e.g., event 1: the asset is bonded to the card). The contactless circuitry may apply a hash function to the TX1. For example, the programming circuitry 522 may include instructions 586, that when executed cause the contactless circuitry to generate a hash of the first transaction (e.g., the hash at 454) from the decentralized entity. Specifically, the initial hash about the first event may include an RND, a device ID, and TX1. Since this is the initial event, the asset has not experienced any other transactions (events) to hash with TX1. The contactless circuitry may utilize a smart contract to verify the hash with the decentralized entity.

For example, the programming circuitry 522 may include instructions 588, that when executed cause the contactless circuitry to verify the hash of the first transaction with the decentralized entity. For example, the contactless circuitry may compare the data from the first event including the hashed TX1 to conditions of a smart contract deployed on the decentralized entity to determine if the first event is an allowable event. In response to the verification of the hashed transaction, the contactless circuitry may receive an approval transaction identification to store with the hash as a local block on the memristor 504. For example, the programming circuitry 522 may include instructions 590, that when executed cause the contactless circuitry to store the verified hashed transaction on the memristor 504 coupled to the card. As such, these events may be stored in the memristor 504 with the hash as local blocks. In this way, the provenance information is stored on-chip and specific to the asset such that they can be reviewed by a user or an owner of the asset in a heuristic format because the events are stored in sequential order.

For example, the programming circuitry 522 may include instructions 592, that when executed cause the contactless circuitry to receive a second transaction (e.g., the second transaction TX2 466) including data from a subsequent event (e.g., the Nth event 450-N) from the decentralized entity. For example, the asset may experience a subsequent (e.g., a second) event. Because the card is bonded to the asset and includes tracking functionality such as the RF interface 510, the contactless circuitry may determine that the that the asset is to be modified during the second event.

For example, the programming circuitry 522 may include instructions 594, that when executed cause the contactless circuitry to hash the second transaction from the decentralized entity, where the second transaction includes information about the second event. In other words, the hashed second transaction includes information about the second event and the hash (or a portion of the hash) of the first transaction.

The contactless circuitry may verify that the second transaction is an allowed transaction. For example, the programming circuitry 522 may include instructions 596, that when executed cause the contactless circuitry to verify that the hashed second transaction abides a contract stored on the decentralized entity. In other words, the contactless circuitry may execute a smart contract on the decentralized entity to verify that the second event is an allowable event. This conformation may be stored with the hashed second transaction as a local block.

For example, the programming circuitry 522 may include instructions 598, that when executed cause the contactless circuitry to store the verified hashed second transaction with the verified hashed first transaction on the memristor 504. The examples instructions discussed in connection with FIGS. 1, 2, 3, 4, and 5 may be repeated for the lifecycle of the asset. In this way, a plurality of events corresponding to transactions of the decentralized entity are hashed by the contactless circuitry of the card coupled to the asset. The hashed transactions are compared to smart contracts to verify that the events are allowable events as stipulated by the smart contract. In this way, the memristor 504 may operate as a local blockchain storing local blocks on the memristor 504 integrated into contactless circuitry bonded to an asset via a device such as the card for the lifetime of the asset.

In the foregoing detailed description of the disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure.

As used herein, the designator "N", particularly with respect to reference numerals in the drawings, indicates that a plurality of the particular feature so designated can be included with examples of the disclosure. The designators can represent the same or different numbers of the particular features. Further, as used herein, "a plurality of" an element and/or feature can refer to more than one of such elements and/or features.

The figures herein follow a numbering convention in which the first digit corresponds to the drawing figure number and the remaining digits identify an element or component in the drawing. Elements shown in the various figures herein may be capable of being added, exchanged, and/or eliminated so as to provide a number of additional examples of the disclosure. In addition, the proportion and the relative scale of the elements provided in the figures are intended to illustrate the examples of the disclosure and should not be taken in a limiting sense.

What is claimed:

1. A device, comprising:
   contactless circuitry to receive data about a plurality of events corresponding to an asset;
   a memristor coupled to the contactless circuitry to store the data about the plurality of events, the contactless circuitry to:
   determine that the asset has experienced an event;
   receive a transaction corresponding to the event from a decentralized entity;
   generate a hash of the transaction including a device identifier of the contactless circuitry and the transaction received from the decentralized entity;
   verify the hashed transaction with the decentralized entity; and
   store the verified hashed transaction on the memristor of the contactless circuitry, wherein the stored verified hash includes information about the event.

2. The device of claim 1, wherein the contactless circuitry verifies the hashed transaction by comparing the hashed transaction with a condition of a smart contract deployed on the decentralized entity.

3. The device of claim 1, wherein the memristor stores a verified hashed transaction record corresponding to each event of the plurality of events.

4. The device of claim 1, wherein the device is coupled to the asset, and the transaction includes the device identifier corresponding to the contactless circuitry and the asset to which the contactless circuitry is coupled.

5. The device of claim 1, wherein the contactless circuitry includes a radio-frequency identification (RF) interface and contactless communication functionality.

6. The device of claim 1, wherein the memristor operates as a local blockchain coupled to the asset.

7. The device of claim 1, wherein the contactless circuitry stores the verified hashed transaction as an immutable record in the decentralized entity and the memristor.

8. The device of claim 1, wherein the plurality of events are, physical modifications of the asset, changes of a location of the asset, a change in state of the asset, a change in ownership of the asset, or a combination thereof.

9. The device of claim 1, wherein the contactless circuitry generates a digital image of the asset to be stored in the decentralized entity and the memristor when the asset is coupled to the device.

10. The device of claim 1, wherein the memristor stores each event of the plurality of events as a verified hashed transaction on the memristor in sequential order.

11. The device of claim 10, wherein each verified hashed transaction corresponding to each event of the plurality of events stored by the memristor includes information about the previously stored transaction.

12. A card, comprising:
    programming circuitry coupled to a memristor, the programming circuitry comprising instructions to:
    receive a first transaction including data from a first event from a decentralized entity;
    generate a hash of the first transaction from the decentralized entity;
    verify the hash of the first transaction with the decentralized entity;
    store the verified hashed transaction on a memristor coupled to the card;
    receive a second transaction including data from a second event from the decentralized entity;
    hash the second transaction from the decentralized entity, wherein the second transaction includes information about the second event;
    verify that the hashed second transaction abides a contract stored on the decentralized entity; and store the verified hashed second transaction with the verified hashed first transaction on the memristor.

13. The card of claim 12, wherein the hash of the second transaction includes information about the first transaction and the first event.

14. The card of claim 12, wherein the contract is a smart contract deployed by an entity associated with the asset.

15. The card of claim 12, wherein the first event is the card providing a unique id of the card and the asset to the decentralized entity to be stored as an immutable record of the asset.

16. The card of claim 12, wherein the plurality of events are stored on the memristor device as verified hashed transactions in a heuristic format.

17. A system, comprising:
a card;
a contactless circuitry including a radio frequency (RF) interface coupled to the card; and
a memristor coupled to the contactless circuitry of the card, the card to:
  receive a first transaction including data from a first event corresponding to an asset from a decentralized entity;
  hash the first transaction with data about the first event;
  store the hashed first transaction as an immutable record in the decentralized entity and the memristor coupled to the card;
  determine that the asset is to be modified during a second event;
  receive a second transaction from the decentralized entity including data about the second event;
  hash the second transaction with data about the second event and the first transaction; and
  store the hashed second transaction as a new immutable record in the decentralized entity and the memristor included in the card.

18. The system of claim 17, further comprising:
compare the data from the first event including the hashed first transaction to conditions of a smart contract deployed on the decentralized entity to determine if the first event is an allowable event.

19. The method of claim 18, further comprising:
determine that the data about the first event abides the conditions of the smart contract;
receive an approval transaction identifier in response to the determination that the data about the first event abides the conditions of the smart contract; and
store the approval transaction identifier in the memristor.

20. The method of claim 18, further comprising:
determine that the data about the first event does not abide the conditions of the smart contract;
receive a rejection transaction identifier in response to the determination that the data about the first event fails to abide the conditions of the smart contract; and
store the rejection transaction identifier to the memristor.

* * * * *